United States Patent
Steiert et al.

(10) Patent No.: US 11,342,298 B2
(45) Date of Patent: May 24, 2022

(54) DIE STACK ARRANGEMENT COMPRISING A DIE-ATTACH-FILM TAPE AND METHOD FOR PRODUCING SAME

(71) Applicant: Infineon Technologies AG, Neubiberg (DE)

(72) Inventors: Matthias Steiert, Ehrenkirchen (DE); Karolina Gierl, Regensburg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 17/023,986

(22) Filed: Sep. 17, 2020

(65) Prior Publication Data

US 2021/0005568 A1    Jan. 7, 2021

Related U.S. Application Data

(62) Division of application No. 16/366,490, filed on Mar. 27, 2019, now Pat. No. 10,861,818.

(30) Foreign Application Priority Data

Mar. 28, 2018  (DE) .......................... 102018204772.3

(51) Int. Cl.
*H01L 23/00* (2006.01)
*B81B 7/02* (2006.01)
(Continued)

(52) U.S. Cl.
CPC ................ *H01L 24/32* (2013.01); *B81B 7/02* (2013.01); *B81C 1/00238* (2013.01);
(Continued)

(58) Field of Classification Search
CPC . B81B 2203/0315–0353; B81B 3/0005–0016; B81B 3/0035–0059; B81B 3/0064–0094; B81B 5/00; B81B 2203/056–06; B81B 2203/0145–0172; B81B 7/0009–0064; B81B 7/0058; B81B 7/0064; B81B 2207/115; B81B 7/0003; B81B 2207/01–03; B81B 2207/07; B81B 2207/092; B81B 2207/097; B81B 7/02; B81B 2201/02; B81B 2201/0264; B81B 2207/012; B81C 1/00238; B81C 1/00261; B81C 2203/01; H01L 2224/81203;
(Continued)

(56) References Cited

U.S. PATENT DOCUMENTS

| 8,982,577 B1 | 3/2015 | Fuentes |
| 2008/0176046 A1 | 7/2008 | Yamaguchi et al. |

(Continued)

FOREIGN PATENT DOCUMENTS

DE    112016000628 T5    11/2017

*Primary Examiner* — Sonya McCall-Shepard
(74) *Attorney, Agent, or Firm* — Slater Matsil, LLP

(57) ABSTRACT

A device includes a base substrate with a sensor component arranged thereon; a spacer layer on the base substrate, wherein the spacer layer is structured in order to predefine a cavity region, in which the sensor component is arranged in an exposed fashion on the base substrate, and a DAF tape element (DAF=Die-Attach-Film) on a stack element, wherein the DAF tape element mechanically fixedly connects the stack element to the spacer layer arranged on the base substrate and to obtain the cavity region.

18 Claims, 5 Drawing Sheets

(51) Int. Cl.
    *B81C 1/00*     (2006.01)
    *H01L 25/065*     (2006.01)
    *H01L 21/56*     (2006.01)
    *H01L 25/07*     (2006.01)
    *H01L 21/67*     (2006.01)
    *H01L 23/10*     (2006.01)
    *H01L 23/13*     (2006.01)

(52) U.S. Cl.
    CPC .......... *H01L 24/27* (2013.01); *H01L 25/0657* (2013.01); *B81B 2201/02* (2013.01); *B81B 2201/0257* (2013.01); *B81B 2201/0264* (2013.01); *B81B 2203/0315* (2013.01); *B81B 2207/012* (2013.01); *B81C 2203/032* (2013.01); *H01L 2224/26135* (2013.01); *H01L 2224/27515* (2013.01); *H01L 2924/1433* (2013.01)

(58) Field of Classification Search
    CPC . H01L 2224/83855; H01L 2224/83862; H01L 2224/83874; H01L 23/34; H01L 23/36; H01L 23/3675; H01L 23/373
    See application file for complete search history.

(56) References Cited

U.S. PATENT DOCUMENTS

| | | |
|---|---|---|
| 2009/0206349 A1 | 8/2009 | Kamada et al. |
| 2009/0321903 A1 | 12/2009 | Shinogi et al. |
| 2012/0235308 A1 | 9/2012 | Takahashi |
| 2014/0118975 A1* | 5/2014 | Chen .................... H05K 1/0281 361/761 |
| 2016/0093791 A1 | 3/2016 | Minervini et al. |
| 2016/0260695 A1* | 9/2016 | Chung .................... H01L 25/18 |
| 2017/0048625 A1* | 2/2017 | Salmon .................... H04R 1/021 |
| 2017/0110426 A1 | 4/2017 | Chen et al. |
| 2017/0323805 A1 | 11/2017 | Kotera et al. |
| 2018/0265347 A1 | 9/2018 | Lee et al. |
| 2019/0031501 A1 | 1/2019 | Bae et al. |

* cited by examiner

200

```
┌─────────────────────────────────────────────────────┐
│  Providing 210 a base substrate 110 with a sensor   │──210
│          component arranged thereon                 │
└─────────────────────────────────────────────────────┘
                          │
                          ▼
┌─────────────────────────────────────────────────────┐
│  Applying 220 a spacer layer 130 on the base substrate 110 │──220
└─────────────────────────────────────────────────────┘
                          │
                          ▼
┌─────────────────────────────────────────────────────┐
│  Structuring 230 the spacer layer 130 in order to expose │──230
│  the sensor component and the associated cavity region   │
└─────────────────────────────────────────────────────┘
                          │
                          ▼
┌─────────────────────────────────────────────────────┐
│  Providing 240 a stack element 160 with a DAF tape element │
│  150 arranged thereon and arranging 250 the stack          │──240,
│  element with the DAF tape element 150 on the              │  250
│                spacer layer 130                            │
└─────────────────────────────────────────────────────┘
                          │
                          ▼
┌─────────────────────────────────────────────────────┐
│  Curing 260 the DAF tape element 150 by means of exerting │
│  heat and/or mechanical pressure in order to solidify the │──260
│       DAF material of the DAF tape element 150.           │
└─────────────────────────────────────────────────────┘
```

FIG. 4

DIE STACK ARRANGEMENT COMPRISING A DIE-ATTACH-FILM TAPE AND METHOD FOR PRODUCING SAME

This application is a divisional of U.S. patent application Ser. No. 16/366,490, filed Mar. 27, 2019, which application claims the benefit of German Application No. 102018204772.3, filed on Mar. 28, 2018, which applications are hereby incorporated herein by reference.

TECHNICAL FIELD

Exemplary embodiments relate to a device, such as a die stack arrangement, for example, comprising a sensor or MEMS component arranged in a cavity region, and furthermore to a method for producing same.

BACKGROUND

Die stacking is a general packaging technique firstly for reducing the resulting package size and secondly for increasing the device functionality. For the case where a MEMS component is intended to be accommodated in a package, currently available stacking processes are not directly applicable. In this case, it is usually necessary for the MEMS component to be the topmost component of the die stack. This is only possible, however, if the MEMS component or the MEMS die is the smallest die in the stack arrangement.

These standard packaging solutions consist, for example, in the fact that at the wafer level a closed lid element is applied on the base substrate over the MEMS structure to be protected, such that during the subsequent stacking steps, i.e. when arranging further stack components, the MEMS structure is protected against so called "glue bleeding" or else against mechanical damage. "Glue bleeding" denotes a process in the context of securing two components by glue, wherein during the curing of the glue, under the action of mechanical pressure and heat, part of the applied glue is forced out of the mechanical contact region between the two components to be connected and accumulates in a manner adjoining the mechanical connection region of the two components.

What is disadvantageous in conventional procedures is that specific front end technologies, such as wafer bonding or film lamination, for example, are required. Furthermore, as a result, relatively large stack heights also arise on account of the cover lid required. Furthermore, such front end technologies applied hitherto are relatively complex and cost intensive.

There is thus a need for a novel configuration of a die stack or a die stack arrangement, and furthermore for a method for producing a corresponding die stack.

In particular, there is a need to provide a die stack and furthermore a method for producing a die stack in which the die stacking process can be carried out even if the MEMS die (also called: MEMS chip) is not the smallest die used in the stacking process.

SUMMARY

Exemplary embodiments relate in particular to a device, such as a die stack arrangement, for example, in which a stack component is arranged on a base substrate by a DAF tape element (DAF=die attach film), wherein a cavity region is maintained between the stack element and the base substrate in a reliable manner, wherein in the cavity region the sensor component is arranged on the base substrate in an exposed fashion.

Exemplary embodiments yield a device comprising a base substrate with a sensor component arranged thereon, a spacer layer on the base substrate, wherein the spacer layer is structured in order to predefine a cavity region, in which the sensor component is arranged in an exposed fashion on the base substrate, and a DAF tape element (DAF=Die Attach Film) on a stack element, wherein the DAF tape element is configured mechanically fixedly to connect the stack element to the spacer layer arranged on the base substrate and to obtain the cavity region.

In accordance with one exemplary embodiment, the spacer layer, adjoining the cavity region, optionally comprises a bleed stopper structure having cutouts, wherein the bleed stopper structure having the cutouts is configured to inhibit capillary crimping or flowing of a DAF material of the DAF tape element in a partly liquefied state.

In accordance with one exemplary embodiment, the bleed stopper structure is configured to exercise a capillary effect on the DAF material of the DAF tape element that is in a partly liquefied state.

In accordance with one exemplary embodiment, the bleed stopper structure arranged in the spacer layer is configured, on account of the capillary effect on the DAF material of the DAF tape element, to guide the partly liquefied DAF material in a targeted manner into the cutouts and to accommodate it there.

Exemplary embodiments furthermore yield a method for producing a stack arrangement, comprising the following steps: providing a base substrate with a sensor component arranged thereon; applying a spacer layer on the base substrate; structuring the spacer layer in order to expose the sensor component and the associated cavity region; providing a stack element having a DAF tape element arranged thereon and arranging the stack element having the DAF tape element on the spacer layer; and curing the DAF tape element by exerting heat and/or mechanical pressure in order to solidify the DAF material of the DAF tape element.

In accordance with one exemplary embodiment, the step of structuring the spacer layer involves optionally forming a bleed stopper structure in the spacer layer in a manner adjoining the cavity region, wherein the bleed stopper structure comprises cutouts. In accordance with one exemplary embodiment, the bleed stopper structure arranged in the spacer layer is configured, on account of the capillary effect on the DAF material of the DAF tape element, to guide the partly liquefied DAF material in a targeted manner into the cutouts and to accommodate it there.

BRIEF DESCRIPTION OF THE DRAWINGS

Preferred exemplary embodiments of the present disclosure are explained in greater detail below with reference to the accompanying drawings, in which:

FIG. 4 shows an exemplary flow diagram having the method steps of a method for producing the device or the stack arrangement in accordance with one exemplary embodiment.

DETAILED DESCRIPTION OF ILLUSTRATIVE EMBODIMENTS

Before exemplary embodiments of the present invention are explained more specifically in detail below with reference to the drawings, it is pointed out that identical functionally equivalent or identically acting elements, objects, function blocks and/or method steps are provided with the same reference signs in the various figures, such that the description of said elements, objects, function blocks and/or method steps (with identical reference signs) that is presented in various exemplary embodiments is mutually interchangeable or can be applied to one another. In the figures, dimensions of structures, elements, layers and/or regions may be illustrated in a manner not to scale for elucidation purposes.

A basic configuration of a device 100 or a stack arrangement, e.g. in the form of a die stack, in accordance with one exemplary embodiment, will now be described below with reference to FIGS. 1a-1b on the basis of a schematic cross sectional view and a schematic plan view.

Figure 1A:
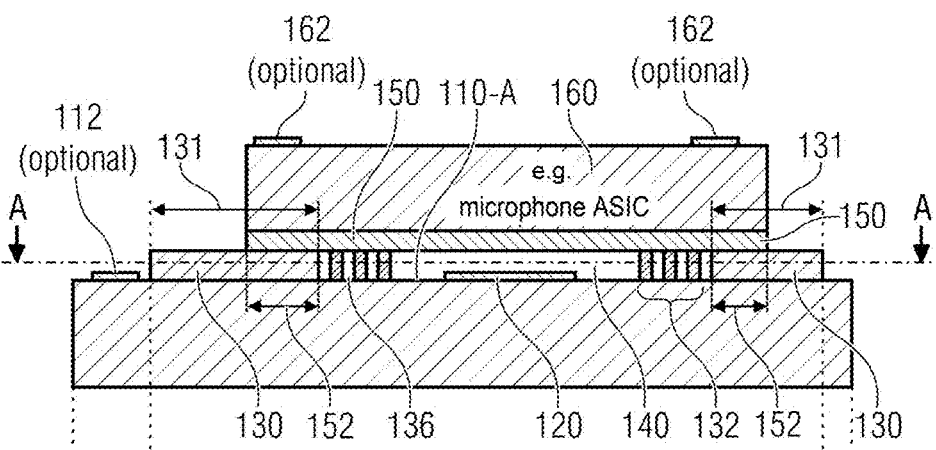
FIG. 1A shows a schematic cross sectional view of a device or a stack arrangement in accordance with one exemplary embodiment.

As is illustrated in the schematic cross sectional view of the device 100 illustrated in FIG. 1a, the device 100 comprises a base substrate 110. The base substrate 110 can comprise for example a conductive, insulating and/or semiconducting material or else combinations thereof. In this regard, the base substrate 110 can be formed for example as a die element (semiconductor element), as a semiconductor wafer, for example a silicon wafer, or else as a (printed) circuit board. A sensor component 120 is arranged on a main surface region 110-A of the base substrate 110. The sensor component 120 can comprise for example a MEMS component, a SAW filter element or some other sensor component which is accessible or exposed to the surrounding atmosphere at least regionally.

In the context of the present description, reference is made for example to so called "MEMS components" (MEMS=microelectromechanical system). MEMS components are considered to be, for example, acoustic sound transducers, such as e.g. capacitive or piezoelectric microphones or loudspeakers, accelerometers, gyroscopes, pressure sensors for relative or absolute pressure measurement, ultrasonic transducers, etc., in which for example one or more movable components mechanically coupled to a base substrate, such as membranes, for example, with electrodes for read out and/or for drive are provided, wherein the electrodes are fitted on the membranes and/or the substrate. In the case of electrostatic MEMS pressure sensors or MEMS sound transducers, the read out is typically achieved by measuring the capacitance between the electrodes. In the case of transducers acting as actuation devices (actuators), such as loudspeakers, for example, the device is driven by applying a potential difference via the electrodes. However, the above enumeration should not be regarded as exhaustive, wherein the present concept is applicable to all microelectromechanical systems.

Furthermore, contact connection pads 112 can be arranged on the base substrate 110, e.g. on the first main surface region 110-A of the base substrate 110. The contact connection pads 112 (referred to as: bondpads) can be provided for electrical contacting with and connection to the sensor component 120 via electrical conductor tracks (not shown in FIG. 1a) arranged on or in the base substrate 110.

The device 100 furthermore comprises a spacer layer 130 on the base substrate 110, wherein the spacer layer 130 is structured in order to predefine a cavity region 140, wherein in the cavity region 140 the sensor component 120 is arranged on the base substrate 110 in an exposed fashion or in a manner accessible to the surrounding atmosphere. By way of example, a pressure port (not shown in FIG. 1a) can be provided in order to connect the cavity 140 fluidically to the surrounding atmosphere that surrounds the device 100. The spacer layer 130 is arranged on the base substrate 110 in a mechanically fixed manner, for example.

The device 100 furthermore comprises a DAF tape element (DAF=die attach film) 150 on a stack element 160, i.e. between the stack element 160 and the spacer layer 130. The DAF tape element 150 is configured, then, mechanically fixedly to connect the stack element 160 to the spacer layer 130 arranged on the base substrate 110 and to obtain the cavity region 140 with the sensor component 120 arranged on the base substrate 110 in an exposed fashion. The cavity region 140 is thus formed for example between the base substrate 110 and the DAF tape element 150 arranged on the stack element 160.

Contact connection pads 162 can optionally be provided on the stack element 160 in order for example to electrically contact semiconductor circuit elements arranged in the stack element 160 via conductor tracks (not shown in FIG. 1a). The stack element 160 can be formed for example as a so called ASIC die (ASIC=Application Specific Integrated Circuit), e.g. for microphone applications. The stack element 160 can for example furthermore be formed merely for providing a covering functionality as a metal or glass lamina e.g. as a lid element for the cavity 140.

To summarize, with regard to the device 100 illustrated in FIG. 1a it can thus be stated that the device 100 in the form of a stack arrangement or a die stack comprises one or more sensor components 20, e.g. MEMS components, on the base substrate 110, wherein the base substrate 110 can be formed for example as a semiconductor chip (die) or else as a semiconductor wafer. The spacer layer 130, which is mechanically fixedly connected to the base substrate 110, is then structured in order to form the cavity region 140 with the sensor component 120 arranged in an exposed fashion therein. The DAF tape element 150 is then arranged on the stack element 160, e.g. an ASIC chip, such that the stack element 160 is mechanically fixedly connected to the spacer layer 130 by the e.g. fully cured DAF tape element 150, wherein the cavity or the cavity region 140 is maintained around the sensor component 120.

The sensor component 120 can be referred to as exposed upwardly (i.e. vertically in the direction of the stack element 160) and laterally (i.e. laterally in the direction of the spacer layer 130) for example owing to the interspace formed by the cavity region 140 between the first main surface region 110 A of the base substrate 110 and the DAF tape element 150.

In accordance with one exemplary embodiment, the spacer layer 130, adjoining or adjacent to the cavity region 140, optionally comprises a so called "bleed stopper structure" 132 (also referred to as: glue bleed stopper structure) for the material or curable glue material of the DAF tape element 150. The optional bleed stopper structure 132, which is illustrated in a hatched manner in FIG. 1a, comprises for example cutouts (not shown in FIG. 1a) in the spacer layer 130, wherein the cutouts of the bleed stopper structure 132 are configured to inhibit capillary creeping or flowing of the material of the DAF tape element 150, which for example is in a partly liquefied state, i.e. the bleed stopper structure 132 is formed as "flow inhibiting" for the material of the DAF tape element 150. The spacer layer 130 thus comprises, for example, a solid spacer layer region 131 and the bleed stopper structure 132 adjoining the latter.

The material of the DAF tape element 150 is in a partly liquefied or viscous state e.g. before full curing. Therefore, the material of the DAF tape element 150, with mechanical pressure and/or elevated temperature being exerted on same, e.g. during the securing of the stack element 160 to the spacer layer 130 or during the curing process of the DAF tape element 150, can be forced laterally out of the mechanical contact region 152 between the spacer layer 130 and the stack element 160 and exhibit capillary creeping or flowing in the direction of the sensor component 120 in the cavity 140. With regard to specific structural configurations of the bleed stopper structure 132, reference is made to the exemplary embodiments in FIGS. 2a-2d.

Reference is furthermore made hereinafter to the schematic plan view—illustrated in FIG. 1b—of the device or stack arrangement 100 in the plane AA of the spacer layer 130 parallel to the main surface region 110 A of the base substrate 110 in accordance with one exemplary embodiment.

Figure 1B:
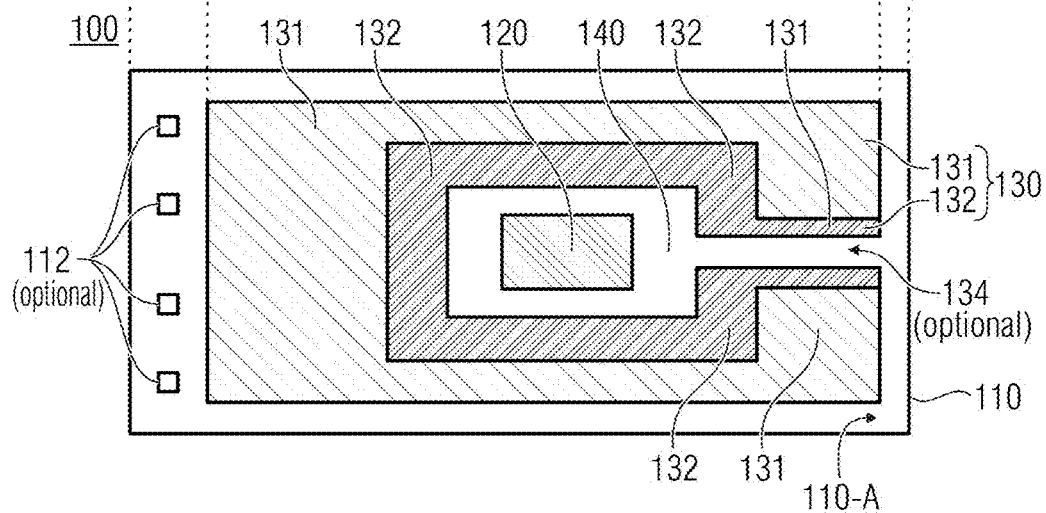
FIG. 1B shows a schematic plan view of the device or stack arrangement in the plane of a spacer layer of the stack arrangement in accordance with one exemplary embodiment.

As is illustrated in FIG. 1b, the spacer layer 130 on the base substrate 110 is structured so as to predefine the cavity region 140, in which the sensor component 120 is arranged on the base substrate 110 in an exposed fashion. Furthermore, the spacer layer 130, adjoining the cavity region 140, optionally comprises the bleed stopper structure 132 having cutouts (not shown in FIG. 1b). As is furthermore illustrated in the schematic plan view in FIG. 1b, the spacer layer has for example an optional pressure port 134 in order optionally to obtain a fluid connection of the cavity region 140 to the surrounding atmosphere that surrounds the device 100. Consequently, pressure changes or sound pressure changes ΔP in the surrounding atmosphere can also be provided in the cavity region 140 and to the sensor element 120.

In accordance with one exemplary embodiment, the access port 140 illustrated in FIG. 1b can however also be provided via the base substrate 110 and/or the stack element 160 having the DAF tape element 150 to the cavity region 140 (not shown in FIGS. 1a-1b). In this regard, reference is made for example to the exemplary embodiment of the device 100 in FIG. 3.

The schematic illustrations illustrated in FIGS. 2a-2d in a plan view of various configurations of the bleed stopper structure 132 e.g. in the spacer layer 130 will now be discussed by way of example hereinafter. What the exemplary embodiments of the bleed stopper structure 132 illustrated below in FIGS. 2a-2d have in common is that the cutouts 136 are arranged in the bleed stopper structure 132 in a manner adjoining the cavity region 140 and furthermore in a manner adjacent to one another around the cavity region 140 and extend e.g. parallel to the main surface region 110 A of the base substrate 110 between the DAF tape element 150 and the base substrate 110.

As is furthermore illustrated in FIGS. 2a-2d, the pressure port 134 can optionally be provided in order to provide a fluid connection between the cavity region 140 and the surrounding atmosphere that surrounds the device 100. Furthermore, it is pointed out that the bleed stopper structure 132 can furthermore have a combination of the configurations of the cutouts 136 illustrated below, that is to say that regionally different configurations of the cutouts 136 can be provided on the bleed stopper structure 132. In this regard, by way of example, different side regions and/or different sections of the side regions of the bleed stopper structure 132 can have different configurations of the cutouts 136.

The cutouts 136 of the bleed stopper structure 132 that are formed in the spacer layer 130 yield, with regard to the partly liquefied or viscous material to be accommodated of the DAF tape element 150, e.g. during a securing and/or curing process of the DAF tape element 150, a defined accommodating volume $V_{136}$ for the flow process of part of the partly liquefied material of the DAF tape element 150, said flow process being brought about on account of the mechanical pressure and/or the elevated temperature. Each cutout 136 of the bleed stopper structure 132 thus yields a defined partial volume $\Delta V_{136}$, wherein with a total number N of cutouts 136 the defined accommodating volume $V_{136} = N \Delta V_{136}$ is obtained.

The required, defined accommodating volume $\Delta V_{136}$ can be determined relatively exactly with knowledge of the material properties of the DAF tape element 150, of the mechanical pressure exerted and of the acting temperature, such that the capillary creeping or flowing of the partly liquefied material beyond the bleed stopper structure 132 into the cavity region 140, which occurs during the securing or curing process of the DAF tape element 150, can be effectively inhibited or prevented. Substantially uncontrolled flowing or creeping of the partly liquefied material of the DAF tape element 150 can thus be effectively prevented by the bleed stopper structure 132. As a result of the specific configuration of the bleed stopper structure 132, the capillary forces acting on the partly liquefied material of the DAF tape element 150 can be set, that is to say that an energetically preferred orientation of the capillary forces can be obtained in order reliably to guide the partly liquefied material of the DAF tape element 150 into the partial volumes $\Delta V_{136}$ provided by the cutouts 136 and to prevent further spreading in the direction of the cavity region 140.

With regard to the schematic illustrations of the cutouts 136 as shown in FIGS. 2a-2d, it is furthermore pointed out that the side surfaces of the cutouts 136 may be formed not exclusively rectilinearly, but also—at least in sections—in a curved fashion, e.g. convexly or concavely, or as a polygon progression.

Figure 2A:
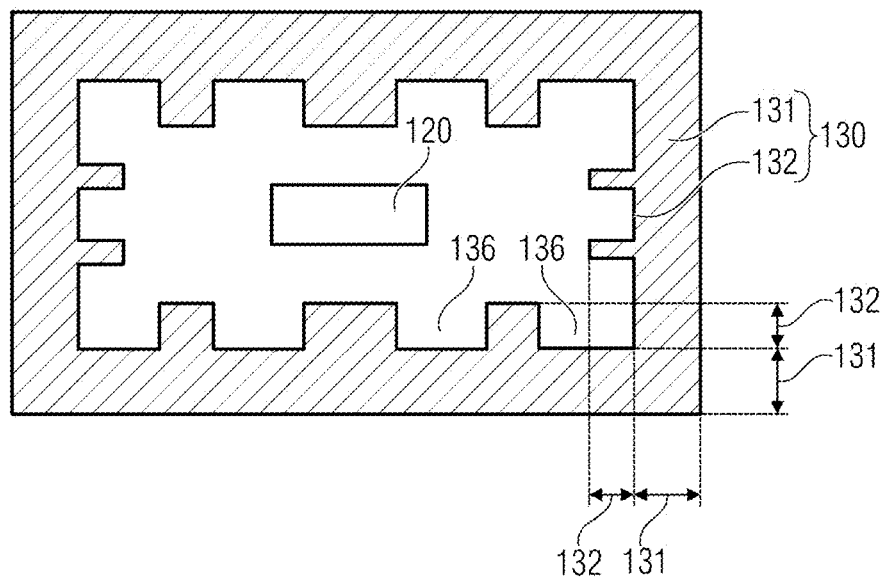
FIGS. 2A, 2B, 2C, and 2D show schematic plan view illustrations of a plurality of different configurations of a bleed stopper structure of the spacer layer adjoining a cavity in accordance with one exemplary embodiment.

As is then illustrated by way of example in the schematic plan view in FIG. 2a, in accordance with one exemplary embodiment, at least one portion of the cutouts 136 of the bleed stopper structure 132 adjoining the cavity region 140 has a rectangular shape.

Figure 2B:
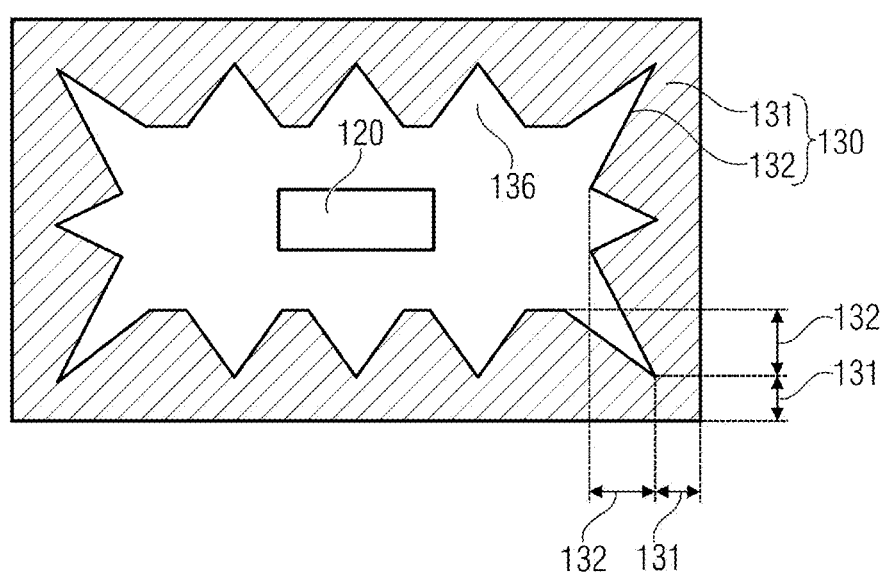

As is shown by way of example in the schematic illustration in FIG. 2b in accordance with a further exemplary embodiment, at least one portion of the cutouts 136 of the bleed stopper structure 132, adjoining the cavity region 140, is formed in a sawtooth shaped fashion. In this regard, at least one portion of the cutouts 136 of the bleed stopper structure can be formed in a widening fashion proceeding from the solid section of the spacer layer 130 in the direction of the cavity region 140.

Figure 2C:
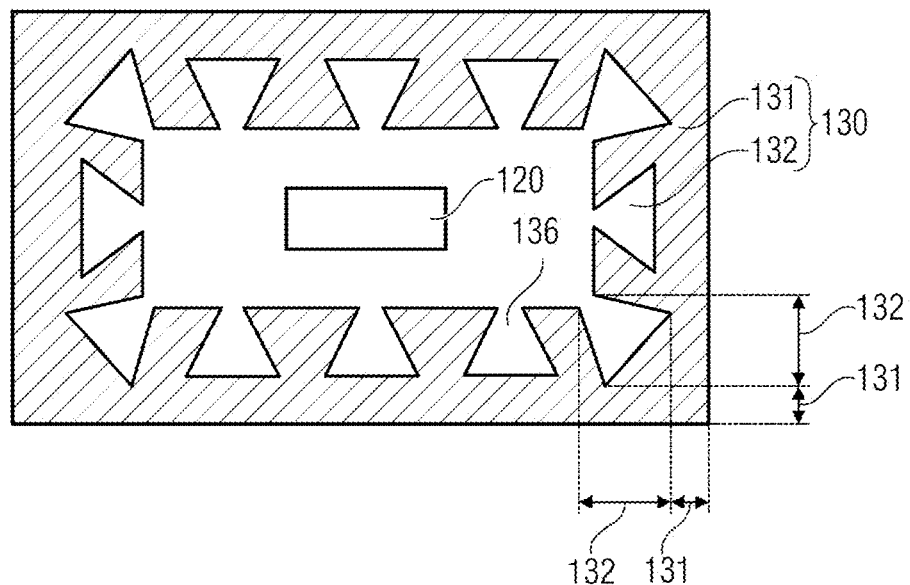

As is shown by way of example in a schematic illustration in FIG. 2c, at least one portion of the cutouts 136 for providing the defined accommodating volume $V_{136}$ can be formed in a tapering fashion proceeding from the solid region of the spacer layer 130 in the direction of the cavity region 140.

Figure 2D:
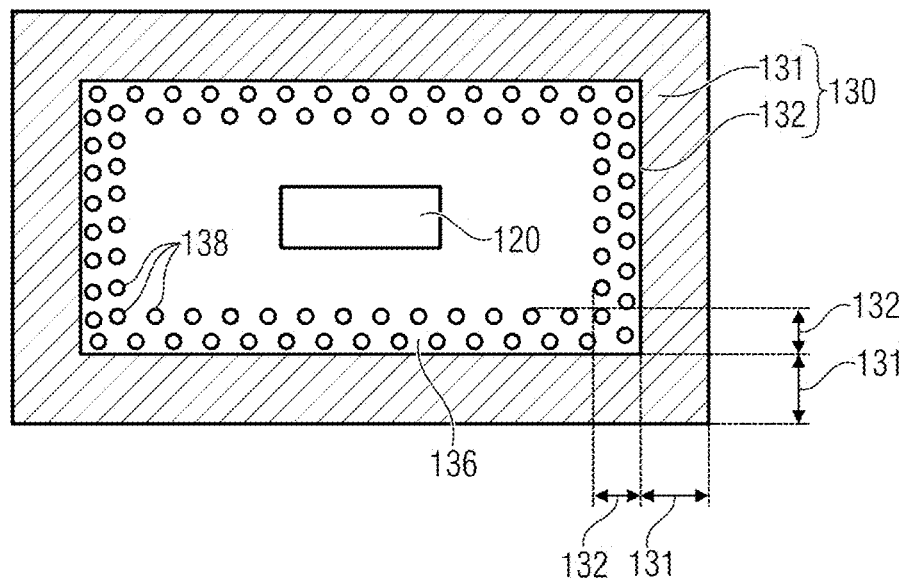

As is shown by way of example in the schematic illustration in FIG. 2d, the bleed stopper structure 132 comprises a columnar structure having a multiplicity of spaced apart columns 138 formed e.g. perpendicular to the main surface region 110-A of the base substrate 110 with the cutouts 136 formed between the adjacent columns 138. The spacing and the diameter of the columns can be varied for example between inner and outer rows of columns with respect to the cavity region 140 in order to set the capillary effects acting on the partly liquefied material of the DAF tape element 150 during a partly liquefied state thereof such that the partly liquefied material of the DAF tape element 150 spreads within the cutouts 136 defined by the columns.

In accordance with one exemplary embodiment, at least one portion of the cutouts 136 for providing the defined accommodating volume $V_{136}$ can be formed in a trench shaped fashion or have a trench structure proceeding from the solid region of the spacer layer 130 in the direction of the cavity region 140.

With regard to the above exemplary embodiments of the bleed stopper structure 132 with reference to FIGS. 2a-2d, it is pointed out that this enumeration should be regarded only as by way of example, but not as exhaustive, wherein the present concept can be applied to further configurations of the bleed stopper structure 132, provided that the bleed stopper structure 132 firstly predefines a defined accommodating volume $V_{136}$ for the material of the DAF tape element 150 in a partly liquefied or viscous state thereof, e.g. during a securing and/or curing process, and furthermore provides for guiding the partly liquefied material of the DAF tape element 150 in a targeted manner by a targeted orientation of the capillary forces on the partly liquefied or viscous material of the DAF tape element 150.

In accordance with one exemplary embodiment, the cavity region 140 can be formed at least partly in a rectangular fashion parallel to the main surface region 110-A of the base substrate 110, wherein the cutouts 136 which are formed in the bleed stopper structure 132 of the spacer layer 130 and which adjoin corner regions of the rectangular cavity region 140 are dimensioned to be larger, for example at least by a factor of 1.5, or 2 than the remaining cutouts 136 adjoining the side regions, i.e. longitudinal and transverse sides, of the rectangular cavity region 140.

In accordance with one exemplary embodiment, the cutouts 136 formed in the bleed stopper structure 132 of the spacer layer 130 are arranged symmetrically around the cavity region 140 with the MEMS component 120 situated therein.

In accordance with one exemplary embodiment, the spacer layer can have for example a thickness in a range of between 5 and 50 µm or in a range of between 10 and 20 µm. In accordance with one exemplary embodiment, the DAF tape element 150 e.g. in a substantially undeformed state of the layer 150 can have a thickness d130 in a range of 5 to 50 µm or in a range of 12 to 20 µm. The DAF tape element can comprise a for example so-called "bi stage material" (also called b stage material), such as e.g. a partly cross-linked epoxy material layer (=a layer composed of a partly crosslinked epoxy material), and can be structured like a film.

A b stage material layer 150 cured in a medium stage is considered to be, for example, a layered b stage epoxy material which is cured (partly polymerized or partly cross-linked) to a medium stage and is still plastically deformable or flexible, but is dimensionally stable enough to form the cavity 140 above the sensor component 120.

A b stage material can comprise for example a medium curing stage (softbake=partly crosslinked or partly polymerized) and a fully cured stage (hardbake=fully crosslinked or fully polymerized), which can be achieved in a targeted manner by corresponding curing processes.

The spacer layer 130 can comprise for example a plastics material from the imide group, i.e. polyimide. Furthermore, the material of the spacer layer 130 can comprise a material comprising epoxy resin, such as e.g. an SU8 material (photoresist).

In accordance with exemplary embodiments, therefore, the spacer layer 130, adjoining the cavity region 140, is provided with a bleed stopper structure 132 for the glue material of the DAF tape element 150 with the cutouts 136, wherein the bleed stopper structure 132 or the correspondingly formed cutouts 136 are configured to inhibit capillary creeping or flowing of the material of the DAF tape element 150 e.g. in a partly liquefied state thereof during the securing and/or curing process, e.g. under the action of mechanical pressure and elevated temperature. The bleed stopper structure 132 thus constitutes a flow inhibiting property for the partly liquefied material of the DAF tape element.

In accordance with one exemplary embodiment, the bleed stopper structure 132 or the corresponding cutouts 136 are configured to exercise a capillary effect on the material of the DAF tape element 150 that is in a partly liquefied state, said capillary effect being in-creased by comparison with that in the cavity region 140. Consequently, the bleed stopper structure 132 arranged in the spacer layer 130 is configured, on account of the (increased) capillary effect thereof on the material of the DAF tape element 150 if the latter is in a partly liquefied state, to guide it into the cutouts 136 in a targeted manner and to accommodate it there.

In accordance with one exemplary embodiment, the bleed stopper structure 132 is configured to accommodate the partly liquefied material of the DAF tape element during a curing process and to inhibit the capillary creeping or flowing process of the partly liquefied material of the DAF tape element 150.

In accordance with one exemplary embodiment, the bleed stopper structure is thus formed in the spacer layer laterally, i.e. parallel to the main surface region 110 A of the base substrate 110, between the cavity region 140 and a solid material region (also called: remaining region) of the spacer layer 130, wherein the spacer layer 130 extends e.g. parallel to the main surface region 110 A of the base substrate 110 and/or a main surface region 160 A of the stack element 160.

In accordance with one exemplary embodiment, the cutouts 136 formed in the spacer layer 130 through the bleed stopper structure 132 yield, with regard to the partly liquefied material to be accommodated of the DAF tape element 150, a defined or predefined accommodating volume $V_{136}$ for the partly liquefied material of the DAF tape element 150.

A schematic cross sectional view of a stack arrangement 100 in accordance with a further exemplary embodiment will now be described below with reference to FIG. 3.

Figure 3:
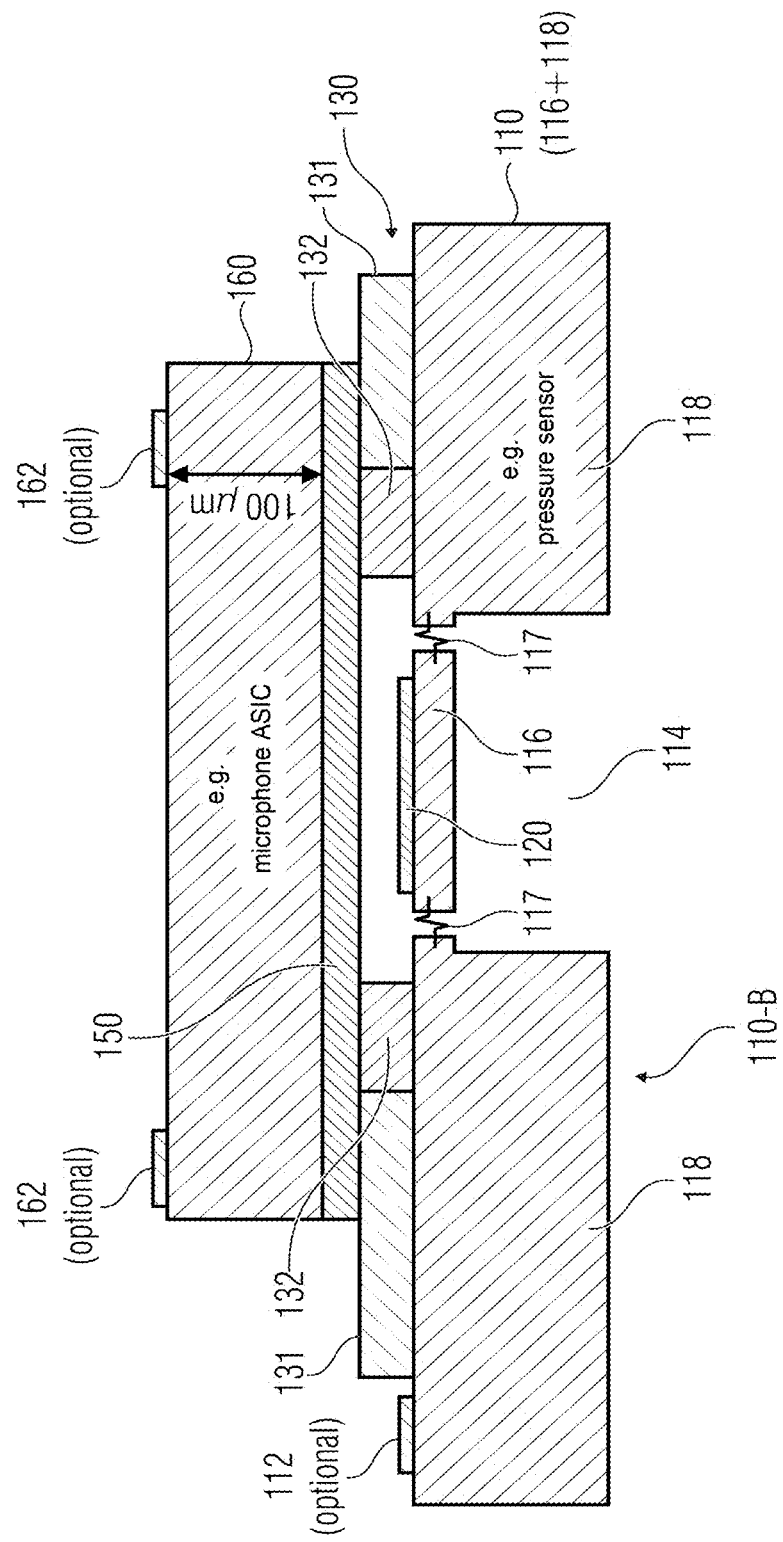
FIG. 3 shows a schematic cross sectional view of a device or a stack arrangement in accordance with a further exemplary embodiment.

The exemplary embodiments illustrated with regard to FIGS. 1a-2b and 2a-2d above are substantially equally applicable to the stack arrangement illustrated in FIG. 3, i.e. in particular the explanations regarding the spacer layer 130 with the optional bleed stopper structure 132.

As is illustrated in FIG. 3, a cutout or base substrate cavity 114 is provided in the base substrate 110 proceeding from the second main surface region 110 B thereof and extends as far as a base substrate partial section 116 on which the sensor component 120 is arranged. The base substrate partial section 116 is mechanically connected or coupled to the remaining region 118 of the base substrate 110 for example by so called "spring elements" or "stress decoupling elements"

117. Since this configuration makes it possible to provide an access port proceeding from the second surface region 110 B of the base substrate 110 to the cavity region 140, via which port the cavity region 140 is fluid connected to the surrounding atmosphere of the device 100, for example, the access port 134 from FIG. 1b can optionally be omitted, for example, such that the spacer layer 130 and the bleed stopper structure 132 can be formed as completely surrounding the cavity region 140.

In the case of the device 100 in FIG. 3, therefore, the sensor component 120 is arranged on the base substrate partial section 116, which is in turn mechanically connected or coupled to the remaining region 118 of the base substrate 110 by the spring elements 117. The spring elements 117 can be provided for the stress decoupling of the material, e.g. the semiconductor material, of the base substrate partial section 116 from the remaining region 118 of the base substrate 110.

Otherwise, the above explanations concerning the exemplary embodiments of the device 100 as discussed with reference to FIGS. 1a-1b and 2a-2b are equally applicable to the device 100 in FIG. 3.

Specific configurations and the resultant technical effects of various elements of the present device or stack arrangement 100 will be discussed in summary once again hereinafter.

The present concept combines the functionality of DAF tapes or DAF tape elements 150 and a specifically configured spacer layer 130 having the glue bleed stopper structure 132, which can be formed for example from an SU8 material or some other epoxy resin material or plastics material (e.g. polyimide). The DAF tape element is substantially non liquid and becomes "creeping" or "flowing" only at the regions with high exerted mechanical force along the cavity edges. However, it is precisely at the cavity edges, i.e. the marginal region of the cavity region 140, that the bleed stopper structure is formed e.g. as an integrated section of the spacer layer 130 as an array of cutouts 136 extending around the cavity region 140, which cutouts will accommodate the bleeding material from the DAF tape element 150, for example during the securing or curing process thereof by elevated mechanical pressure and/or elevated temperature. Finally, the cavity region 140 can be formed by the topmost stack element 160, which can be formed for ex-ample as an ASIC die/chip (e.g. a microphone ASIC) or else as a metal or glass laminar, with the spacer layer 130 arranged thereon.

In accordance with exemplary embodiments, the spacer layer 130 can then comprise, in the region adjoining the cavity or the cavity region 140, the so called "bleed stopper structure" 132 for suppressing capillary creeping or flowing of the partly liquefied DAF material 150 during the process of attaching the stack element 160 provided with the DAF tape element 150 to the spacer layer 130 or during the curing of the material of the DAF tape element 150. The bleed stopper structure 132 can have various geometric shapes, for example, such as e.g. columns perpendicular to the die plane, i.e. perpendicular to the main surface region 110 A of the base substrate 110, widening and/or tapering in the direction of the cavity region 140 with the MEMS component 120, e.g. in the form of a sawtooth pattern parallel to the die plane or else rectangular parallel to the die plane.

The function of the bleed stopper structure 132 comprises, then, in preventing or controlling capillary creeping or flowing of the DAF material in the direction of the MEMS component 120 in the cavity 140 during the process of joining together the stack elements or during the curing of the DAF layer element and the partial liquefaction of the material of the DAF tape element that inevitably occurs there. For this purpose, in the transition region between the solid spacer layer and the cavity 140 (with the sensor component 120), the bleed stopper structure 132 comprises a column structure, sawtooth structure, trapezoidal structure, rectangular structure, etc., which at least inhibits or prevents uncontrolled flowing of the partly liquefied DAF material on account of the capillary forces (brought about as a result of the specific configuration of the bleed stopper structure).

The bleed stopper structure 132 thus yields firstly, for the partly liquefied DAF material, a flow movement inhibiting region on account of increased capillary forces on the partly liquefied DAF material, and secondly a volume which is set in a targeted manner and is enlarged sufficiently to accommodate the partly liquefied DAF material flowing or creeping in capillary fashion under elevated temperature and/or elevated mechanical pressure influence and to stop the movement of said material in the direction of the cavity region 140 in a defined manner, such that substantially defined cavity dimensions can be achieved above and laterally with respect to the sensor component 120 during production even as a mass produced product, e.g. at the wafer level.

Furthermore, the bleed stopper structure 132 provided makes it possible to obtain the function of mechanical intermeshing of the DAF material with the spacer layer 130, as a result of which an increase in the mechanical strength of the stack arrangement 100 with the sensor component 120 can be obtained. The structured region of the bleed stopper structure of the spacer layer 130 can thus obtain a connection over the largest possible area via the DAF material of the DAF tape element between the stack element 160 and the spacer layer 130 arranged on the base substrate 110 in order to achieve a large bonding area or a large mechanical contact area and thus an increased mechanical stability between the layers of the stack arrangement 100.

In the case of the bleed stopper structure 132, at the corners of the cavity region 140 by enlarged cutouts 136 more space or room can be kept available in order to be able to accommodate the partly liquefied DAF material that is usually forced in there to an increased extent. Furthermore, the bleed stopper structure 132 is arranged for example symmetrically around the cavity region 140 and thus around the sensor component 120. Consequently, the bleed stopper structure 132 yields a defined stop region for the partly liquefied DAF material and thus provides defined lateral and also vertical dimensions for the cavity region 140.

The device or stack arrangement 100 as described above makes it possible to achieve a reduced overall height of the package or stack. Furthermore, very low defined cavity heights of less than 10 µm are able to be realized. Furthermore, it is possible that the packaging or stack arrangement process can be carried out directly after the front end of line process (FEOL process), e.g. at the wafer level.

An exemplary flow diagram of a method for producing the device or stack arrangement 100 in accordance with one exemplary embodiment will now be described below with reference to FIG. 4.

In the method 200 for producing a stack arrangement 100, firstly a step 210 involves providing a base substrate 110 with a sensor component 120 arranged thereon.

A step 220 involves forming or applying a spacer layer 130 on the base substrate 110. This can be carried out by a deposition process, for example.

A step 230 involves structuring the spacer layer 130 in order to expose the sensor component 120 and the associated cavity region 140. Structuring 230 the spacer layer 130 can be carried out by photolithographically exposing the sensor or MEMS component 120 and the associated cavity region 140, wherein optionally it is furthermore possible to form a bleed stopper structure 132 in a manner adjoining the cavity region 140 in the spacer layer 130.

A step 240 involves providing a stack element 160 with a DAF tape element 150 arranged thereon, wherein a step 250 involves arranging or mechanically fixing the stack element 160 with the DAF tape element 150 arranged thereon on the spacer layer 130. Mechanically fixing the stack element 160 with the DAF tape element 150 arranged thereon on the spacer layer 130 can for example already be carried out by exerting mechanical pressure and bring about capillary creeping or flowing of the partly liquefied DAF material of the DAF tape element 150.

In a step 260, the DAF tape element 150 can be cured by exerting heat and/or mechanical pressure in order to solidify the DAF material of the DAF tape element 150.

In accordance with one exemplary embodiment, in the step of structuring 230 the spacer layer 130, it is possible to form the optional bleed stopper structure 132 in the spacer layer 130 in a manner adjoining the cavity region 140, wherein the bleed stopper structure 132 comprises cutouts 136. The bleed stopper structure 132 can be provided for example by an etching process at the region between the cavity region 140 and the continuous or solid spacer layer 130.

The base substrate 110 can be formed for example as a die element (semiconductor element), as a semiconductor wafer, for example a silicon wafer, or else as a (printed) circuit board. If the base substrate 110 is formed as a semiconductor wafer, e.g. a silicon wafer, as a further optional step the base substrate 110 with the elements arranged thereon can also be singulated in order to provide singulated components.

In accordance with one exemplary embodiment, the cutouts 136 arranged in the bleed stopper structure 132 can be configured, during step 150 of arranging or during step 160 of curing the DAF tape element 150, on account of providing capillary forces on the partly liquefied DAF material of the DAF tape element 150, to guide the partly liquefied DAF material in a targeted manner into the cutouts 136 and to accommodate it there.

In accordance with one exemplary embodiment, the bleed stopper structure 132 arranged in the spacer layer 130 can be configured, on account of the capillary effect on the partly liquefied DAF material of the DAF tape element 150, at least to inhibit capillary creeping or flowing of the partly liquefied DAF material of the DAF tape element 150 into the cavity region 140.

Although some aspects of the present disclosure have been described as features in the context of a device, it is clear that such a description can likewise be regarded as a description of corresponding method features. Although some aspects have been described as features in association with a method, it is clear that such a description can also be regarded as a description of corresponding features of a device or of the functionality of a device.

In the detailed description above, in some instances different features have been grouped together in examples in order to rationalize the disclosure. This type of disclosure ought not to be interpreted as the intention that the claimed examples have more features than are expressly indicated in each claim. Rather, as represented by the following claims, the subject matter can reside in fewer than all features of an individual example disclosed. Consequently, the claims that follow are hereby incorporated in the detailed description, wherein each claim can be representative of a dedicated separate example. While each claim can be representative of a dedicated separate example, it should be noted that although dependent claims refer back in the claims to a specific combination with one or more other claims, other examples also comprise a combination of dependent claims with the subject matter of any other dependent claim or a combination of each feature with other dependent or independent claims. Such combinations shall be encompassed, unless an explanation is given that a specific combination is not intended. Furthermore, the intention is for a combination of features of a claim with any other independent claim also to be encompassed, even if this claim is not directly dependent on the independent claim.

Although specific exemplary embodiments have been illustrated and described herein, it will be apparent to a person skilled in the art that a multiplicity of alternative and/or equivalent implementations can be substituted for the specific exemplary embodiments shown and illustrated there, without departing from the subject matter of the present application. This application text is intended to cover all adaptations and variations of the specific exemplary embodiments discussed and described herein. Therefore, the present subject matter of the application is limited only by the wording of the claims and the equivalent embodiments thereof.

What is claimed is:

1. A method for producing a stack arrangement, comprising the following steps:
   providing a base substrate with a sensor component arranged thereon;
   applying a spacer layer on the base substrate;
   structuring the spacer layer in order to expose the sensor component and an associated cavity region;
   providing a stack element having a DAF (Die Attach Film) tape element arranged thereon and arranging the stack element having the DAF tape element on the spacer layer; and
   curing the DAF tape element by exerting heat and/or mechanical pressure in order to solidify DAF material of the DAF tape element,
   wherein structuring the spacer layer comprises forming a bleed stopper structure in the spacer layer in a manner adjoining the cavity region, and wherein the bleed stopper structure comprises cutouts, and wherein the spacer layer comprises a pressure port to obtain a fluid connection of the cavity region to a surrounding atmosphere that surrounds the stack arrangement.

2. The method as claimed in claim 1, wherein the cutouts arranged in the bleed stopper structure are configured, during the step of curing the DAF tape element, due to providing capillary forces on partly liquefied DAF material of the DAF tape element, to guide the partly liquefied DAF material in a targeted manner into the cutouts and to accommodate it there.

3. The method as claimed in claim 1, wherein the cutouts comprise a rectangular shape.

4. The method as claimed in claim 1, wherein the cutouts comprise a sawtooth shape.

5. The method as claimed in claim 1, wherein the cutouts comprise a tapering shape.

6. The method as claimed in claim 1, wherein the cutouts comprise a curved shape.

7. The method as claimed in claim 1, wherein the cutouts comprise a combination of at least two differently-shaped types of cutouts.

8. The method as claimed in claim 1, wherein the base substrate comprises a base substrate cavity.

9. A method for producing a stack arrangement, comprising:
proving a base substrate with a sensor component arranged thereon;
applying a spacer layer on the base substrate;
structuring the spacer layer in order to expose the sensor component and an associated cavity region;
providing a stack element having a DAF (Die Attach Film) tape element arranged thereon and arranging the stack element having the DAF tape element on the spacer layer; and
forming a bleed stopper structure in the spacer layer in a manner adjoining the cavity region,
wherein the bleed stopper structure comprises cutouts, and wherein the cutouts arranged in the bleed stopper structure are configured, during curing the DAF tape element, to guide partly liquefied DAF material into the cutouts and to accommodate it there, and wherein the spacer layer comprises a pressure port to obtain a fluid connection of the cavity region to a surrounding atmosphere that surrounds the stack arrangement.

10. The method of claim 9, wherein curing the DAF tape element comprises exerting heat and/or mechanical pressure in order to solidify DAF material of the DAF tape element.

11. The method of claim 9, wherein the cutouts comprise a rectangular shape.

12. The method of claim 9, wherein the cutouts comprise a sawtooth or tapering shape.

13. The method as claimed in claim 9, wherein the cutouts comprise a curved shape.

14. A method for producing a stack arrangement, comprising:
providing a spacer layer in the stack arrangement comprising a component and an associated cavity region;
providing a stack element having a DAF (Die Attach Film) tape element arranged thereon and arranging the stack element having the DAF tape element on the spacer layer; and
forming a bleed stopper structure in the spacer layer in a manner adjoining the cavity region,
wherein the bleed stopper structure comprises cutouts, and wherein the cutouts arranged in the bleed stopper structure are configured, during curing the DAF tape element, to guide partly liquefied DAF material into the cutouts and to accommodate it there, and wherein the spacer layer comprises a pressure port to obtain a fluid connection of the cavity region to a surrounding atmosphere that surrounds the stack arrangement.

15. The method of claim 14, wherein curing the DAF tape element comprises exerting heat and/or mechanical pressure in order to solidify DAF material of the DAF tape element.

16. The method of claim 14, wherein the cutouts comprise a rectangular or triangle shape.

17. The method of claim 14, wherein the cutouts comprise a curved shape.

18. The method of claim 14, wherein the cutouts are formed by a columnar structure in the bleed stopper structure having a multiplicity of spaced apart columns.

* * * * *